(12) United States Patent
Joshi et al.

(10) Patent No.: US 6,566,749 B1
(45) Date of Patent: May 20, 2003

(54) SEMICONDUCTOR DIE PACKAGE WITH IMPROVED THERMAL AND ELECTRICAL PERFORMANCE

(75) Inventors: Rajeev Joshi, Cupertino, CA (US); Steven Sapp, Felton, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/050,428

(22) Filed: Jan. 15, 2002

(51) Int. Cl.[7] .......................... H01L 23/10; H01L 23/34
(52) U.S. Cl. ...................... 257/706; 257/712; 257/678; 257/784; 257/589
(58) Field of Search ................................. 257/704–722, 257/782–784, 584, 587, 282, 322, 355, 678, 780

(56) References Cited

U.S. PATENT DOCUMENTS

| | | |
|---|---|---|
| 4,193,083 A | 3/1980 | Max |
| 4,213,141 A | 7/1980 | Colussi |
| 4,393,392 A | 7/1983 | Hale |
| 5,095,343 A | 3/1992 | Klodzinski et al |
| 5,309,014 A | 5/1994 | Wilson |
| 5,455,457 A * | 10/1995 | Kurokawa |
| 5,513,072 A | 4/1996 | Imaji et al. |
| 5,872,403 A * | 2/1999 | Bowman et al. |
| 5,889,319 A | 3/1999 | Moller et al. |
| 6,020,617 A | 2/2000 | Jos |
| 6,069,386 A | 5/2000 | Jos |
| 6,112,378 A * | 9/2000 | Lee |
| 6,133,634 A | 10/2000 | Joshi |
| 6,177,834 B1 | 1/2001 | Blair et al. |
| 6,211,462 B1 | 3/2001 | Carter, Jr. et al. |

OTHER PUBLICATIONS

Wood et al., "High Performance Silicon LDMOS Technology for 2GHz RF Power Amplifier Applications,"IEEE, pp. 4.2.1–4.2.4, 0–7803–3393–4 (1996).

* cited by examiner

*Primary Examiner*—Wael Fahmy
*Assistant Examiner*—Dilinh Nguyen
(74) *Attorney, Agent, or Firm*—Townsend, Townsend, and Crew LLP

(57) ABSTRACT

A semiconductor die package is disclosed. In one embodiment, the package includes a semiconductor die comprising a vertical power transistor. A source electrode and a gate contact region are at the first surface of the semiconductor die. A drain electrode is at the second surface of the semiconductor die. A base member is proximate to the second surface of the semiconductor die and is distal to the first surface of the semiconductor die and a cover disposed over the first surface of the semiconductor die. The cover is coupled to the base member and is adapted to transfer heat away from the semiconductor die.

22 Claims, 5 Drawing Sheets

SEMICONDUCTOR DIE PACKAGE WITH IMPROVED THERMAL AND ELECTRICAL PERFORMANCE

BACKGROUND OF THE INVENTION

The present invention relates in general to semiconductor packaging, and in particular to package structures and methods of manufacture that are particularly suitable for radio frequency (RF) circuit applications.

The use of radio frequency (RF) amplifiers in, for example, wireless communication networks, is well known. With the considerable recent growth in the demand for wireless services, such as personal communication services (PCS), the operating frequency of wireless networks has increased dramatically and is now well into the gigahertz (GHz) frequencies. RF power amplification devices are used, e.g., in antenna base stations.

FIG. 1 shows a cross-sectional view of a portion of a conventional VDMOS (vertical diffused metal oxide semiconductor) package 220. The package 220 includes a semiconductor die 200 including source and gate regions (not shown) proximate the upper surface and a drain region (not shown) proximate the bottom surface. The semiconductor die 200 is disposed on top of a drain lead 202. A source contact layer 210 is connected to the source region and a gate 212 is in the die 200. A first wire 216 couples a source lead 206 to the source contact layer 210. A second wire 226 couples the gate 212 to a chip capacitor 214 that is used for impedance matching. A third wire 228 couples the chip capacitor 214 to a gate lead 204.

The semiconductor die 200 could alternatively comprise a bipolar RF transistor. For example, the base, emitter, collector, and the base of the bipolar RF transistor formed in the die 200 would respectively correspond to the source, drain, and gate of the VDMOS.

While the package shown in FIG. 1 is effective in some instances, a number of improvements could be made. For example, it would be desirable to reduce the source inductance in the device. Low inductance minimizes signal degradation, attenuation, and distortion.

It would also be desirable to increase the amount of heat that is removed from the package when it is in operation. RF power transistors generate a significant amount of heat. For example, 50% efficiency is not atypical of class A amplifiers. For high output power applications (e.g., more than 60 Watts), special packaging is required to facilitate the dissipation of heat from the power transistor to prevent overheating and further loss of efficiency. Overheating can also degrade the operational characteristics of a power transistor. For some applications, it is desirable to keep the temperature of the semiconductor die in an RF package to less than 100° C. during operation.

It would further be desirable to address the above-noted problems, while enabling conventional input impedance matching.

Embodiments of the invention address these and other problems.

SUMMARY OF THE INVENTION

Embodiments of the invention are directed to semiconductor die packages and methods of making semiconductor die packages.

One embodiment of the invention is directed to a semiconductor die package comprising: a semiconductor die including a vertical power transistor, wherein the semiconductor die has a first surface and a second surface; a source electrode at the first surface of the semiconductor die; a gate contact region at the first surface of the semiconductor die; a drain electrode at the second surface of the semiconductor die; a base member, wherein the base member is proximate to the second surface of the semiconductor die and is distal to the first surface of the semiconductor die; and a cover disposed over the first surface of the semiconductor die, wherein the cover is coupled to the base member and is adapted to transfer heat away from the semiconductor die.

Another embodiment of the invention is directed to a semiconductor die package comprising: a semiconductor die comprising a vertical power transistor, wherein the semiconductor die has a first surface and a second surface; a source electrode at the first surface of the semiconductor die; a gate contact region at the first surface of the semiconductor die; a drain electrode at the second surface of the semiconductor die; a base member, wherein the base member is proximate to the second surface of the semiconductor die and is distal to the first surface of the semiconductor die; a first lead frame element electrically coupling the source electrode to the base member; a second lead frame element electrically coupling the gate contact region to the base member; and a joining structure coupled to at least the first or the second lead frame element.

Another embodiment of the invention is directed to a semiconductor die package comprising: a semiconductor die comprising a vertical diffused metal oxide semiconductor (VDMOS) RF power transistor, wherein the semiconductor die has a first surface and a second surface; a source electrode at the first surface of the semiconductor die; a gate contact region at the first surface of the semiconductor die; a drain electrode at the second surface of the semiconductor die; a base member comprising an insulated metal substrate, wherein the base member is proximate to the second surface of the semiconductor die and is distal to the first surface of the semiconductor die; a cover disposed over the first surface of the semiconductor die, wherein the cover is coupled to the base member and is adapted to transfer heat away from the semiconductor die; a plurality of securing members securing the cover to the base member; and a matching network coupled to the gate contact region.

Another embodiment of the invention is directed to a method for making a semiconductor die package, the method comprising: attaching a semiconductor die to a base member, wherein the semiconductor die comprises a vertical power transistor, a first surface, a second surface, a source electrode at the first surface of the semiconductor die, a gate contact region at the first surface of the semiconductor die, and a drain electrode at the second surface of the semiconductor die; and attaching a cover to the base member, wherein the cover is coupled to the base member and is adapted to transfer heat away from the semiconductor die.

Another embodiment of the invention is directed to a method for making a semiconductor die package, the method comprising: attaching a semiconductor die to a base member, wherein the semiconductor die comprises a vertical power transistor, a first surface, a second surface, a source electrode at the first surface of the semiconductor die, a gate contact region at the first surface of the semiconductor die, and a drain electrode at the second surface of the semiconductor die; attaching a first lead frame element to the source electrode and to the base member; attaching a second lead frame element to the gate contact region and to the base member; and attaching a joining structure to at least the first or the second lead frame element.

These and other embodiments can be described with reference to the foregoing Figures and Detailed Description.

DETAILED DESCRIPTION OF SPECIFIC EMBODIMENTS

Embodiments of the invention are directed to semiconductor die packages and methods of making semiconductor die packages. The die packages can be used in RF power applications and can include power transistors. The power transistors can be used in high output power applications (e.g., in the range of 80 to 100 Watts, or more). In some embodiments of the invention, the semiconductor dies include transistors that can be used as active devices in an RF power amplifier. Such amplifiers may operate at frequencies in a range from below 1000 Hz to 2000 MHz and above.

The transistor devices in the semiconductor dies can include vertical power transistors. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. During operation, the current flow from the source region to the drain region in a VDMOS device is substantially perpendicular to the die surfaces. In other embodiments, the transistors in the semiconductor dies can be bipolar transistors. In such embodiments, one side of the semiconductor die can have an emitter region and a base region. The other side of the die can have a collector region.

Vertical power transistor devices have advantages over LDMOS (lateral diffused metal oxide semiconductor) devices, which have source regions and drain regions at the same side of a semiconductor die. For example, the cells in a VDMOS are smaller and more dense than the cells in an LDMOS device, since the source region and the drain region in a VDMOS device are at opposite sides of the semiconductor die. Consequently, a VDMOS device can have a lower "on" resistance than an LDMOS device. Also, VDMOS devices generally exhibit higher gain and higher saturation current than LDMOS devices.

As noted, LDMOS dies have the face of the die as the drain and the gate with the backside of the die as the source. RF VDMOS dies have the face of the die as the gate and the source with the backside as the drain. In embodiments of the invention, the gate, source, and drain connections to an RF VDMOS die can have some similarities to those used in a conventional RF LDMOS package. Semiconductor packages according to embodiments of the invention accomplish this.

Embodiments of the invention using vertical power transistors can be described with reference to FIGS. 2 to 7.

Figure 2:
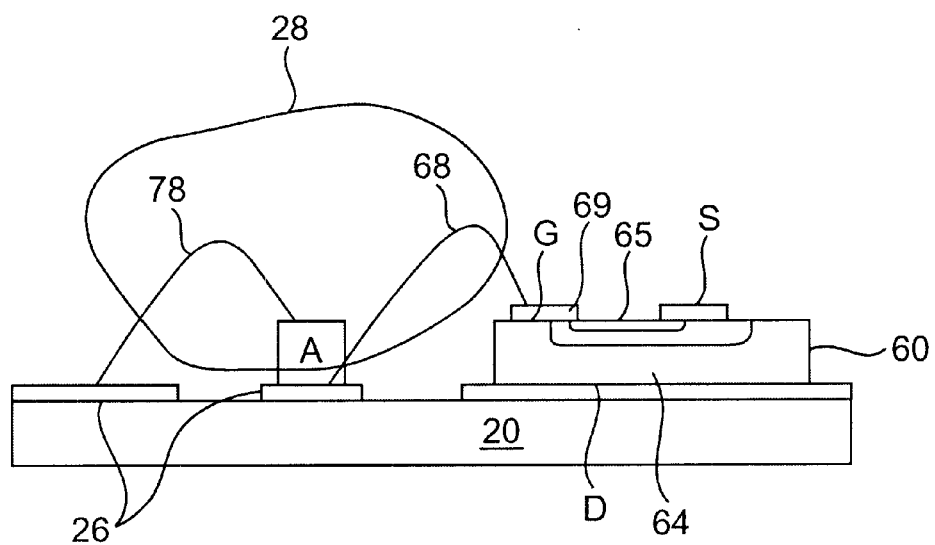
FIG. 2 shows a perspective view of an insulated metal substrate.

FIG. 2 shows a semiconductor die 60 comprising an RF power VDMOS transistor mounted on an insulated metal substrate 20. The semiconductor die 60 includes a first surface and a second surface opposite to the first surface, and may comprise a semiconductor material such as silicon. In this example, the first surface of the semiconductor die 60 is distal to the insulated metal substrate 20, while the second surface of the semiconductor die 60 is proximate to the insulated metal substrate 20. In the simplified structure shown in FIG. 2, a gate contact region G and a source electrode S are at the first surface, and a drain electrode D is at the second surface of the semiconductor die 60. The semiconductor die 60 also includes a planar gate structure 69, a drain region 64, and a source region 65. The planar gate structure 69, the drain region 64, and the source region 65 can respectively correspond to the gate contact region G, the drain electrode D, and the source electrode S. Although a planar gate structure 69 is shown in the package, the gate structure could alternatively be a trench gate structure. In addition, it is to be understood that FIG. 2 provides a partial depiction of only one transistor cell, and that some embodiments include multiple source and gate regions corresponding to multiple cells in the semiconductor die 60.

In a specific embodiment that is particularly suited for RF applications, a matching network 28 (e.g., a Q matching network) comprised of elements A (e.g., a chip capacitor), 68, and 78 is provided on the insulated metal substrate 20. Bonding pads 26 are electrically coupled to the matching network 28 through conductive elements (e.g., wires, traces) 26, 68, 78. The chip capacitors A may, in turn, be coupled to a gate contact region G of the semiconductor die 60 through a wire 68. Although one wire is shown for purposes of illustration, it is understood that there may be many wires in the die package. In other embodiments, the wire 68 could alternatively be a lead frame element.

In some embodiments, the matching network 28 may include semiconductor die capacitors (silicon MOS capacitors). These capacitors can be used to tune either or both of the input and/or output terminals of the power transistor. The MOS capacitors can be coupled to the transistor terminals using parallel small diameter wires so that the capacitance and inductance can be adjusted to specifically match the input and/or output signal of the power transistor to an amplifier circuit. For example, any suitable number of wires 68 may be bonded to the gate contact region G and the bonding pads 26 to tune the input terminal of the power transistor.

The matching network 28 can be mounted to the insulated metal substrate 20 using any suitable process. For example, in some embodiments, a metal layer such as a metal tape may be deposited on the insulated metal substrate. Then, a mask such as a solder mask may be formed on the metal tape. The mask may have apertures. Matching network components such as capacitors may be inserted into the apertures and mounted on the metal tape. The capacitors are electrically coupled to each other through the metal layer under the mask and by wires.

A conductive layer (not shown) can be on the semiconductor die 60 and coupled to the source electrode S. It can comprise, for example, a conductive metal such as solder and can provide a bonding pad for electrical contact between the source electrode S of the semiconductor die 60 and an external conductor (not shown). Another conductive layer (not shown) can be used to electrically couple the insulated metal substrate 20 and the semiconductor die 60 together. The conductive layer between the insulated metal substrate 20 and the semiconductor die 60 may comprise a die attach material such as solder or a conductive adhesive.

Figure 3:
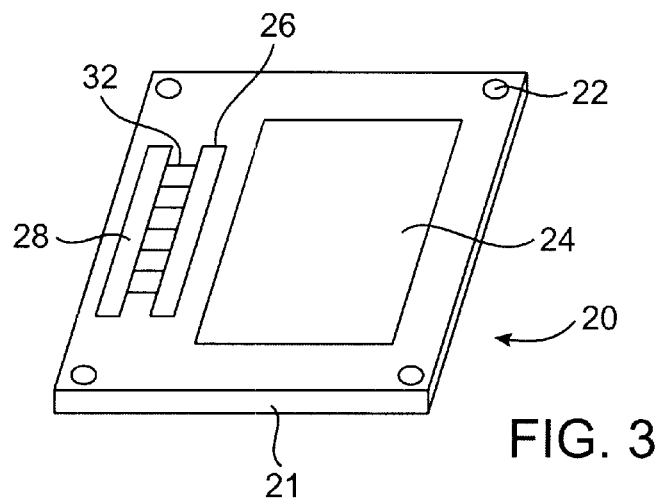
FIG. 3 is a side cross-sectional view of a portion of a semiconductor die package according to an embodiment of the invention.

FIG. 3 shows a perspective view of an exemplary insulated metal substrate 20. In this example, the insulated metal substrate 20 includes a drain metallization region 24. The drain metallization region 24 is a substantially continuous layer of conductive material. It can receive substantially all of the drain current from the semiconductor die (not shown) that is mounted on the insulated metal substrate 20 on top of the drain metallization region 24. In this example, four holes 22 are present at the corners of the insulated metal substrate 20. These holes 22 can be aligned with holes in a cover (not shown) and securing members (not shown) may, but do not necessarily pass through the aligned holes and may or may not secure the cover to the insulated metal substrate 20. As noted above, a matching network 28 may be on the insulated metal substrate 20. (In some embodiments, bonding pads 26 on the insulated metal substrate 20 may be provided to receive a capacitor to be coupled to the external connectors 28 through wires thus forming a matching network.)

The insulated metal substrate 20 may have one or more insulation layers formed on a metal base that is made of a thermally conductive metal. The thermally conductive metal may comprise any suitable material. Examples of suitable materials include aluminum, copper clad aluminum, copper, and the like. The one or more insulation layers on the insulated metal substrate 20 may comprise any suitable electrically insulating material. Suitable materials include, for example, epoxy-based, or polyimide-based resin or the like. In addition, one or more suitable wiring pattern(s) and/or interconnecting vias may also be present in the insulated metal substrate 20.

The insulated metal substrate 20 is one example of a base member that can be used to support one or more semiconductor dies. In other embodiments, the base member supporting the one or more semiconductor dies may include, for example, a direct bond copper (DBC) substrate with a ceramic plate sandwiched between two copper plates. In another example, the base member may comprise a thermally conductive plate with a metallized isolation layer on the thermally conductive plate. The metallized isolation layer may include, for example, a beryllium oxide (BeO) plate and a conductive region that is to be coupled to the drain electrode of the semiconductor die.

Figure 4A:
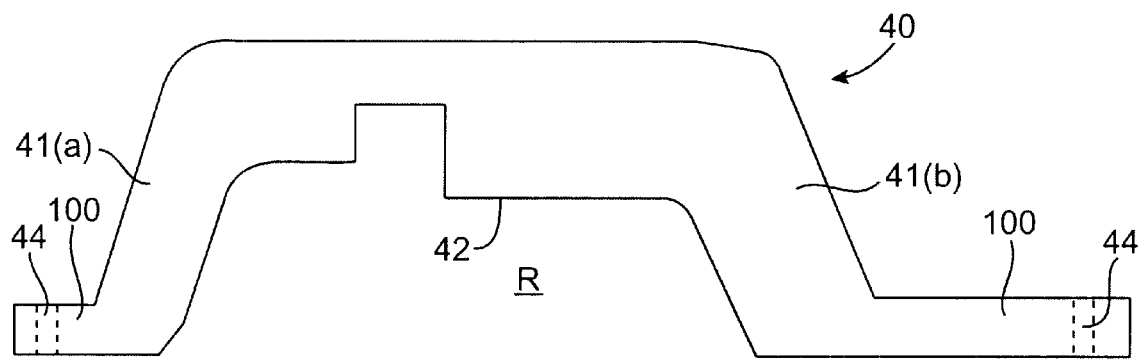
FIG. 4(a) shows a side cross-sectional view of a cover according to an embodiment of the invention.
Figure 4B:
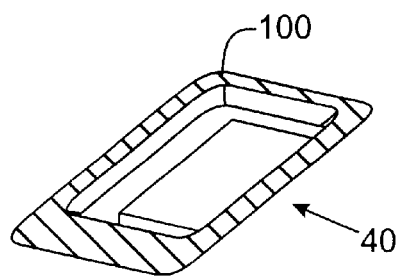
FIG. 4(b) shows a perspective view of a cover according to an embodiment of the invention.

After the semiconductor die 60 is attached to the insulated metal substrate 20, a cover is attached to the insulated metal substrate 20 to form a die package. Exemplary cover embodiments are shown in FIGS. 4(a) and 4(b). The cover 40 defines a recess R that can house a semiconductor die (not shown). A protruding portion 42 of the cover 40 extends into the recess R. Wall extrusions 41(a), 41(b) surround the protruding portion 42 and extend past the protruding portion 42. Mating region 100 may have a portion including a hole 44 that is shaped to sit against the insulated metal substrate. Securing members (not shown) can pass through the holes 44 in the cover 20 and corresponding holes in the insulated metal substrate 20. The cover 40 comprises a thermally and electrically conductive material and is adapted to transfer heat away from the semiconductor die 60. Suitable thermally and electrically conductive materials include metals such as copper and aluminum. In some embodiments, the cover 40 may be a stamped or extruded solid metal piece with a continuous mating region 100.

Figure 5:
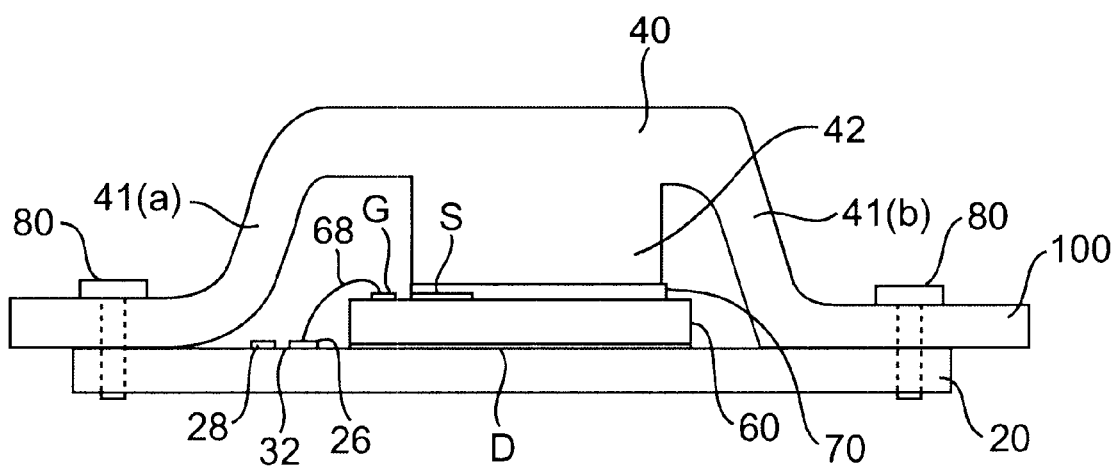
FIG. 5 is a side cross-sectional view of a semiconductor die package according to an embodiment of the invention.

Referring to FIG. 5, securing members 80 may pass through the cover 40 and may be used to attach the assembly shown in FIG. 5 to an external heat sink. Exemplary securing members 80 may be bolts or screws, etc. As shown in FIG. 5, the securing members 80 may pass through aligned holes in the cover 40 and the insulated metal substrate 20. The holes in the cover 40 and the insulated metal substrate 20 may be threaded or unthreaded. The securing members 80 may be conductive so that an electrical path can be created between the cover 40 and the insulated metal substrate 20. The securing members 80 can also ensure thermal connection to an external heat sink. The cover 40 may be attached to the insulated metal substrate 20 using solder.

When the cover 40 is mounted on the insulated metal substrate 20 to form a die package, the protruding portion 42 extends toward the semiconductor die 60. An end of the protruding portion 42 indirectly or directly contacts the conductive layer 70. The source electrode S is thus electrically coupled to the protruding portion 42 of the cover 40 so that the source current passes from the insulated metal substrate 20 through the cover 40 and to the source electrode S of the semiconductor die 60. Note that in the embodiment shown in FIG. 5 the shape of the protruding portion 42 vis a vis the wall 41(b) inside the cover 40 is slightly different than the embodiment shown in FIG. 4. Other similar variations and alternatives are possible.

In some embodiments, the cross-sectional area (i.e., parallel to the plane of the semiconductor die 60) of the protruding portion 42 may be less than the surface area of the first surface of the semiconductor die 60. When the protruding portion 42 is coupled to the source electrode S, the gate contact region G at the first surface is exposed so that it can be coupled to an external electrical conductor such as a wire. As shown in FIG. 5, a wire 68 can couple the gate contact region G and the matching network 28 together. The wire 68 may be disposed between a space formed by the wall 41(a) and the protruding portion 42 of the cover 40.

A consideration in power RF package design is the use of the source terminal, which is the reference ground, as a thermal conduction path. The use of the source terminal as a thermal path minimizes series inductance, and improves the thermal and electrical resistance. The protruding portion 42 of the cover 40 is a relatively wide and flat conductor that is thermally conductive. It can serve as both a thermal path (i.e., it can act as a heat sink) and a low resistance electrical path to the source electrode S. Consequently, series inductance and thermal resistance are reduced. Furthermore, the protruding portion 42 grounds the source electrode S of the semiconductor die 20. By grounding the source electrode S, distortion in the signal is minimized.

Figure 1:
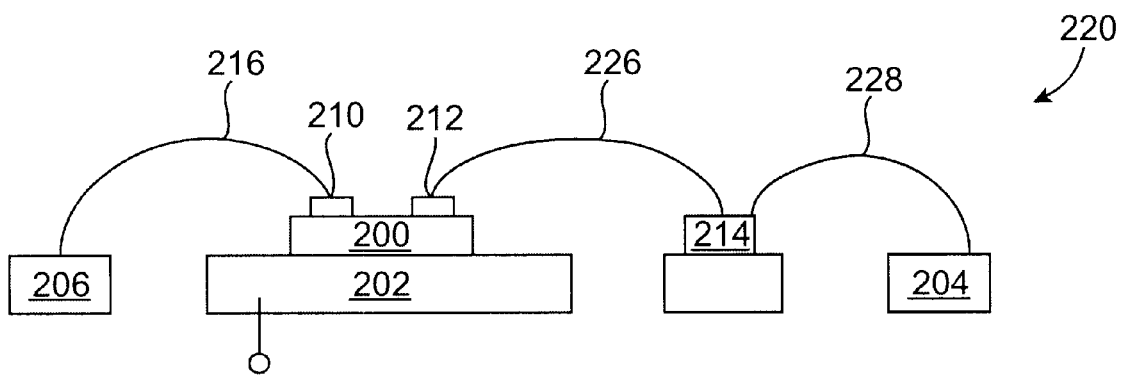
FIG. 1 shows a portion of a simplified conventional VDMOS power RF transistor package.

Heat can be directed away from the semiconductor die 60 through the cover 40 and the insulated metal substrate 20. Heat is thus removed from both of the major surfaces of the semiconductor die 60 to keep it at a suitable operating temperature. It can be maintained at a suitable operating temperature without reducing the thickness of the semiconductor die 60. In comparison, heat is removed from only one side of a semiconductor die (see, e.g., FIG. 1) in a conventional VDMOS package. By improving the heat dissipation properties of the die package, the maximum operating power of the package can be increased and the likelihood of device failure due to excessive heating is reduced.

In addition, in the die package embodiment shown in FIG. 5, wires need not be used to supply source current to the semiconductor die or transport drain current away from the semiconductor die. The conductors that contact the source electrode and the drain electrode of the semiconductor die are relatively wide and flat, thus reducing the likelihood of inductance in the conductors. Eliminating wires connecting to the drain/collector and/or source/emitter of a power transistor can decrease the inductance of the input and output terminals of the package. Low inductance in, for example, the output signal path of the power transistor package minimizes signal degradation, attenuation, and distortion.

Also, the die package shown in FIG. 5 can be made quickly. For example, using the cover 40 to house the semiconductor die 60 permits the die package to be made without a molding step. The cover 40 can simply be placed on the insulated metal substrate 20 and over the semiconductor die 60 to form a package without encapsulating the semiconductor die 60 in a polymeric encapsulant.

As noted above, in some embodiments, the semiconductor die 60 can be attached (e.g., bonded) to the insulated metal substrate 20 before joining the cover 40 and the semiconductor die 60 together. Attaching the semiconductor die 60 to the insulated metal substrate 20 together before attaching an additional heat sink structure to the semiconductor die 60 has some advantages. By attaching the semiconductor die 60 to the insulated metal substrate 20 first, subassemblies without matching networks or with different quantities of power transistors can be maintained in inventory. Chip package precursors having different combinations of power transistors and matching networks can be attached to the covers to form desired die packages as the demand for the die packages occurs.

Figure 6:
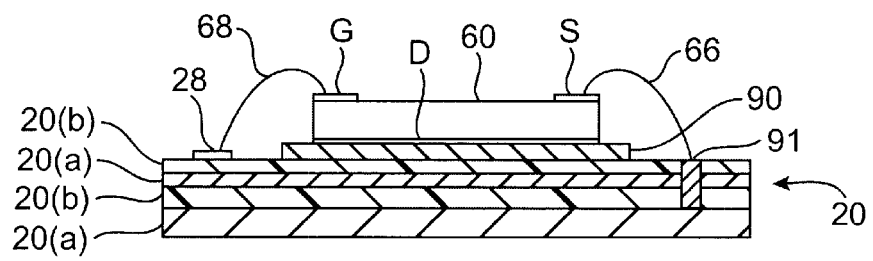
FIG. 6 is a side cross-sectional view of a portion of a semiconductor die package according to an embodiment of the invention.

FIG. 6 shows another embodiment of the invention. (For clarity of illustration, source regions, drain regions, and gates are not shown in FIGS. 6–8.) FIG. 6 shows a semiconductor die 60 comprising a VDMOS transistor on an insulated metal substrate 20. In this example, the source electrode S is electrically coupled to the insulated metal substrate 20 with a wire 66. As shown in FIG. 6, the wire 66 may be coupled to a conductive via 91 in the insulated metal substrate 20. The gate contact region G is coupled to a matching network 28 on the insulated metal substrate 20 through a conductive wire 68. Although wires 66, 68 couple the gate contact region G and the source electrode S to the insulated metal substrate 20, the wires 66, 68 may be replaced by conductive lead frame elements in other embodiments.

Figure 7:
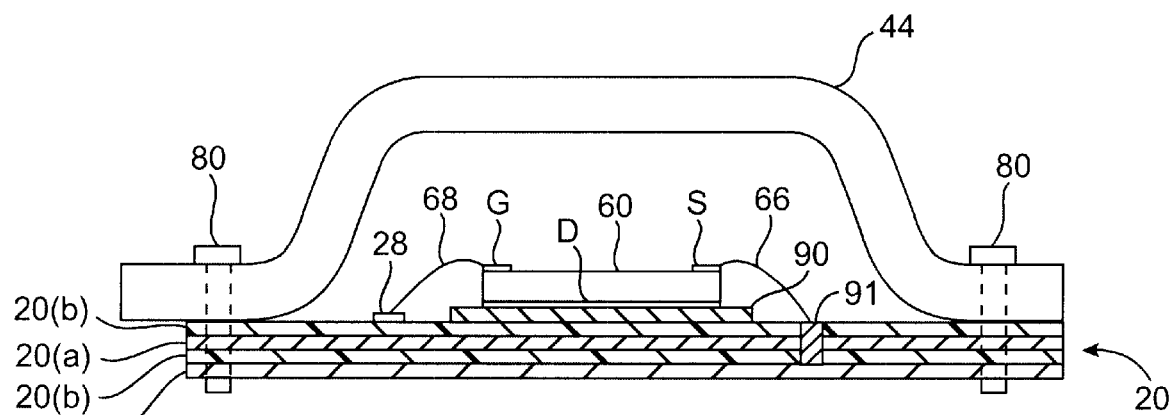
FIG. 7 is a side cross-sectional view of a semiconductor die package according to an embodiment of the invention.

The insulated metal substrate 20 may have the same or different characteristics as the previously described insulated metal substrates. In FIGS. 6 and 7, the conductive layers 20(a), insulating layers 20(b), and an interconnecting via 91 in the insulated metal substrate are shown. The conductive and insulating layers, and vias in the insulated metal substrate can be configured so that source, drain, and/or gate current paths are electrically isolated from each other.

Referring to FIG. 7, a cover 44 is on the insulated metal substrate 20. Securing members 80 pass through aligned holes in the cover 44 and the insulated metal substrate 20. The cover 44 is adapted to transfer heat away from the semiconductor die 60. Like the cover 40 in the previously described embodiments, the cover 44 comprises a thermally conductive material. Suitable thermally conductive materials include metals such as copper and aluminum. Most metals have a thermal conductivity between about 100 W/m·K to about 400 W/m·K.

Heat from the semiconductor die 60 passes through the insulated metal substrate 20 and to the cover 44. In this embodiment, the cover 44 is spaced from the source electrode S. Although the conductive cover 44 is spaced from the source electrode S, heat is effectively removed from the semiconductor die 60 through the insulated metal substrate 20 and the cover 44, thus reducing the likelihood of device failure due to excessive heating.

Figure 8:
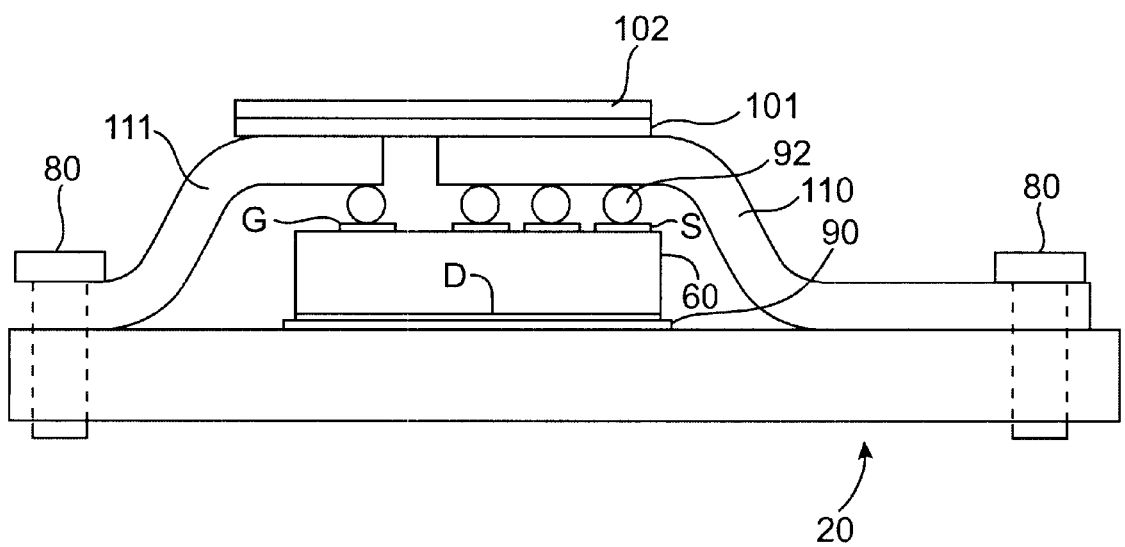
FIG. 8 is a side cross-sectional view of a semiconductor die package according to an embodiment of the invention.

FIG. 8 shows yet another embodiment of the invention. FIG. 8 shows a semiconductor die package comprising a semiconductor die 60 that is disposed on an insulated metal substrate 20. The semiconductor die 60 is electrically and thermally coupled to the insulated metal substrate 20 through a conductive layer 90. A pair of lead frame elements 110, 111 couple the source electrode S and the gate contact region G of the semiconductor die 60 to the insulated metal substrate 20. Solder 92 (or other conductive material) can be used to join the lead frame elements 110, 111 to the source electrode S and the gate contact region G. Securing members 80 may pass through the lead frame elements 110, 111 to the insulated metal substrate 20. The securing members 80 may provide an electrical path between the insulated metal substrate 20, the lead frame elements 110, 111, and an external heat sink (not shown). A joining structure 102 made of a thermally conductive metal may be coupled to the lead frame elements 110, 111 for structural reasons and to remove heat from the semiconductor die 60 through the gate and the source terminals. The joining structure 102 may be bonded to the lead frame elements 110, 111 using an adhesive bonding layer 101. The adhesive bonding layer 101 may comprise, for example, polyimide insulating tape. The embodiment shown in FIG. 8 can be a chip scale package (CSP).

In other embodiments, the lead frame element 111 may be replaced by a wire that may be bonded to a matching network component (not shown) on the insulated metal substrate 20. In this case, the joining structure 102 may be coupled to only the lead frame element 110. The purpose of the joining structure 102 is to connect (for structural purposes) the gate and source lead frame elements.

The embodiment shown in FIG. 8 can be fabricated in any suitable manner. For example, after attaching the semiconductor die 60 to the insulated metal substrate 20, the lead frame elements 110, 111, the bonding layer 101, and the joining structure 102 may be bonded to the semiconductor die 60.

The embodiment shown in FIG. 8 has advantages. For instance, the embodiment shown in FIG. 8 can be manufactured relatively quickly and inexpensively. For example, covers with specialized configurations need not be used in this embodiment. Also, heat is conducted away from both sides the semiconductor die 60. Both the joining structure 102 and the insulated metal substrate 20 conduct heat away from the first and second surfaces of the semiconductor die 60. Removing heat from the semiconductor die 60 decreases the likelihood of device failure due to excessive heating.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A semiconductor die package comprising:
   a semiconductor die comprising a vertical power transistor, wherein the semiconductor die has a first surface and a second surface;
   a source electrode at the first surface of the semiconductor die;
   a gate contact region at the first surface of the semiconductor die;
   a drain electrode at the second surface of the semiconductor die;
   a base member, wherein the base member is proximate to the second surface of the semiconductor die and is distal to the first surface of the semiconductor die; and
   a cover disposed over the first surface of the semiconductor die,
   wherein the cover is coupled to the base member and is adapted to transfer heat away from the semiconductor die, and wherein the cover grounds the source electrode.

2. The semiconductor die package of claim 1 wherein the vertical power transistor is a vertical diffused metal oxide semiconductor (VDMOS).

3. The semiconductor die package of claim 1 wherein the cover comprises a thermally conductive metal.

4. The semiconductor die package of claim 1 further comprising a plurality of securing members passing through a mating region of the cover and the base member.

5. The semiconductor die package of claim 1 wherein the vertical power transistor is a vertical diffused metal oxide semiconductor (VDMOS) RF power transistor.

6. The semiconductor die package of claim 1 further comprising a matching network electrically coupled to the gate contact region.

7. The semiconductor die package of claim 1 wherein the gate contact region is spaced from the cover, and wherein the semiconductor die package further comprises:
   a wire electrically coupling the gate contact region and the base member.

8. The semiconductor die package of claim 1 wherein the base member comprises an insulated metal substrate.

9. The semiconductor die package of claim 1 further comprising a matching network comprising chip capacitors and wires coupled to the gate contact region.

10. The semiconductor die of claim 1 wherein the base member comprises an insulated metal substrate and components of a matching network, wherein the components of the matching network are formed in the insulated metal substrate, and wherein the components comprise inductors or capacitors.

11. The semiconductor die package of claim 1 wherein the base member comprises a direct bond copper substrate.

12. A semiconductor die package comprising:
   a semiconductor die comprising a vertical power transistor, wherein the semiconductor die has a first surface and a second surface;
   a source electrode at the first surface of the semiconductor die;
   a gate contact region at the first surface of the semiconductor die;
   a drain electrode at the second surface of the semiconductor die;
   a base member, wherein the base member is proximate to the second surface of the semiconductor die and is distal to the first surface of the semiconductor die; and
   a cover disposed over the first surface of the semiconductor die, wherein the cover comprises a protruding portion electrically coupled to the source electrode.

13. The semiconductor die package of claim 12 wherein the vertical power transistor is a vertical diffused metal oxide semiconductor (VDMOS).

14. The semiconductor die package of claim 12 wherein the cover comprises a thermally conductive metal.

15. The semiconductor die package of claim 12 further comprising a plurality of securing members passing through a mating region of the cover and the base member.

16. The semiconductor die package of claim 12 wherein the vertical power transistor is a vertical diffused metal oxide semiconductor (VDMOS) RF power transistor.

17. The semiconductor die package of claim 12 further comprising a matching network electrically coupled to the gate contact region.

18. The semiconductor die package of claim 12 wherein the gate contact region is spaced from the cover, and wherein the semiconductor die package further comprises:
   a wire electrically coupling the gate contact region and the base member.

19. The semiconductor die package of claim 12 wherein the base member comprises an insulated metal substrate.

20. The semiconductor die package of claim 12 further comprising a matching network comprising chip capacitors and wires coupled to the gate contact region.

21. The semiconductor die of claim 12 wherein the base member comprises an insulated metal substrate and components of a matching network, wherein the components of the matching network are formed in the insulated metal substrate, and wherein the components comprise inductors or capacitors.

22. The semiconductor die package of claim 12 wherein the base member comprises a direct bond copper substrate.

* * * * *